United States Patent
Tsai et al.

(10) Patent No.: US 6,564,449 B1
(45) Date of Patent: May 20, 2003

(54) METHOD OF MAKING WIRE CONNECTION IN SEMICONDUCTOR DEVICE

(75) Inventors: Yu Fang Tsai, Kaohsiung (TW); Jian Wen Chen, Kaohsiung (TW); Min Lung Huang, Kaohsiung (TW)

(73) Assignee: Advanced Semiconductor Engineering, Inc., Taiwan (CN)

( * ) Notice: Subject to any disclaimer, the term of this patent is extended or adjusted under 35 U.S.C. 154(b) by 170 days.

(21) Appl. No.: 09/706,748

(22) Filed: Nov. 7, 2000

(51) Int. Cl.[7] .............................................. H05K 3/36
(52) U.S. Cl. .................. 29/830; 29/27; 29/40; 29/41; 29/46
(58) Field of Search .................... 29/832, 830, 839, 29/840, 841, 827, 846; 228/180.5, 4.5, 245, 254; 438/613–615, 617, 626; 257/777

(56) References Cited

U.S. PATENT DOCUMENTS

| 4,558,346 A | * | 12/1985 | Kida et al. | 228/123.1 |
| 5,328,079 A | * | 7/1994 | Mathew et al. | 228/180.5 |
| 5,476,211 A | * | 12/1995 | Khandros | 228/180.5 |
| 5,735,030 A | * | 4/1998 | Orcutt | 174/52.4 |
| 5,976,964 A | * | 11/1999 | Ball | 438/123 |
| 6,162,664 A | * | 12/2000 | Kim | 438/126 |
| 6,291,271 B1 | * | 9/2001 | Lee et al. | 438/121 |
| 6,321,976 B1 | * | 11/2001 | Lo et al. | 228/180.5 |
| 6,333,562 B1 | * | 12/2001 | Lin | 257/777 |
| 6,400,007 B1 | * | 6/2002 | Wu et al. | 257/686 |

* cited by examiner

Primary Examiner—Timothy V. Eley
Assistant Examiner—David T Nguyen

(57) ABSTRACT

A method of making a wire connection in a semiconductor device, the method comprising: (a) forming an under bump metallurgy (UBM) over a chip including the bonding pad formed thereon; (b) forming a gold bump on the UBM at a location corresponding to the bonding pad; (c) etching the UBM with the gold bump as a mask; and (d) connecting one end of a bonding wire to a conductive lead by ball bonding and the other end thereof to the gold bump on the bonding pad of the chip by stitch bonding. The conductive lead is located external to the chip as a part of a lead frame or a substrate. Alternatively, the semiconductor chip having bumps may be formed by electroless plating a nickel layer on the bonding pads of the chip, and followed by electroless plating a gold layer on the nickel layer. It is noted that the semiconductor chip having metal bumps is formed by wafer bumping process. Therefore, it is easy to obtain metal bumps having a uniform profile thereby significantly enhancing the reliability of stitching bonding formed on the metal bumps.

21 Claims, 6 Drawing Sheets

METHOD OF MAKING WIRE CONNECTION IN SEMICONDUCTOR DEVICE

BACKGROUND OF THE INVENTION

1. Field of the Invention

This invention generally relates to a method of making a wire connection in a semiconductor device, and more particularly to bonding of wire between a bonding pad on a semiconductor chip and a second bonding location.

2. Description of the Related Art

As electronic devices have become more smaller and thinner, the packages for protecting and interconnecting IC chips have the same trend, too.

Referring to FIG. 1, prior art wire bonding techniques make the wire interconnection between the chip bond pad 210 and the substrate contact pad 230 by making a ball bond to the chip bond pad 210, forming a loop therebetween, and making a stitch bond to the substrate contact pad 230 to finish the wire interconnect. The normal loop height is generally about 10 to 15 mils. As thinner packages have been developed, the loop height has been reduced with conventional bonding techniques down to about 6 mils in height by changes in the loop parameters, profile and wire types. However, this loop height is considered to be a minimum obtainable loop height as attempts to go lower have caused wire damage and poor wire pull strengths.

The loop height can be reduced to about 0.002 inches by the use of an entirely different wire bonding technique disclosed in U.S. Pat. No. 5,735,030. Referring now to FIGS. 2a and 2b, there is shown a process flow for wire bonding in accordance with U.S. Pat. No. 5,735,030. Initially, as shown in FIG. 2a, a protuberance 200 is formed on the chip bond pad 210 by first ball bonding the free end of an electrically conductive wire onto the chip bond pad 210, and thereafter stitch bonding the same wire to its ball bonded end at a point on the wire immediately adjacent the ball bonded end such that the ball bond and stitch bond together form the protuberance 200. Thereafter, as shown in FIG. 2b, using a ball bonding tool, first ball bonding one end of a bonding wire 220 to the substrate contact pad 230 and thereafter stitch bonding the other end of the bonding wire 220 to the protuberance 200 on the chip bond pad 210. The protuberance 200 is used to prevent the ball bonding tools from damaging the passivation area of the chip immediately surrounding the pad 210 during stitch bonding of the wire 220. However, it is very difficult to form protuberances with uniform profile by the method described in U.S. Pat. No. 5,735,030. Typically, the wires 220 are all formed by the wire bonding machine with identical operation parameters. Therefore, protuberances with irregular profile will adversely affect the stitch.bonding of wire 220 thereby reducing the reliability of finished package.

SUMMARY OF THE INVENTION

It is therefore an object of the present invention to overcome the problems and disadvantages associated with the above-described technique for making a wire connection in a semiconductor device.

In order to accomplish the object, the present invention provides a method of making a wire connection in a semiconductor device including an electrically conductive lead forming part of a substrate or leadframe, and a semiconductor chip having a bonding pad formed on the active surface thereof, the method comprising: (a) forming an under bump metallurgy (UBM) over the active surface of the chip including the bonding pad; (b) forming a gold bump on the UBM at a location corresponding to the bonding pad; (c) etching the UBM with the gold bump as a mask; and (d) connecting one end of a bonding wire to the conductive lead by ball bonding and the other end thereof to the gold bump on the bonding pad of the chip by stitch bonding. Alternatively, the semiconductor chip having bumps may be formed by electroless plating a nickel layer on the bonding pads of the chip, and followed by electroless plating a gold layer on the nickel layer. Furthermore, the method of the present invention is equally applicable where chip-to-chip connections are required.

Since the bumps of the present invention are all formed in a single step, it is easy to obtain bumps with good uniformity, i.e., having a uniform profile. This will significantly enhance the reliability of reverse wire bonding thereby obtaining a low profile package without sacrificing the reliability thereof.

BRIEF DESCRIPTION OF THE DRAWINGS

Other objects, advantages, and novel features of the invention will become more apparent from the following detailed description when taken in conjunction with the accompanying drawings.

DETAILED DESCRIPTION OF THE PREFERRED EMBODIMENTS

Figure 1:
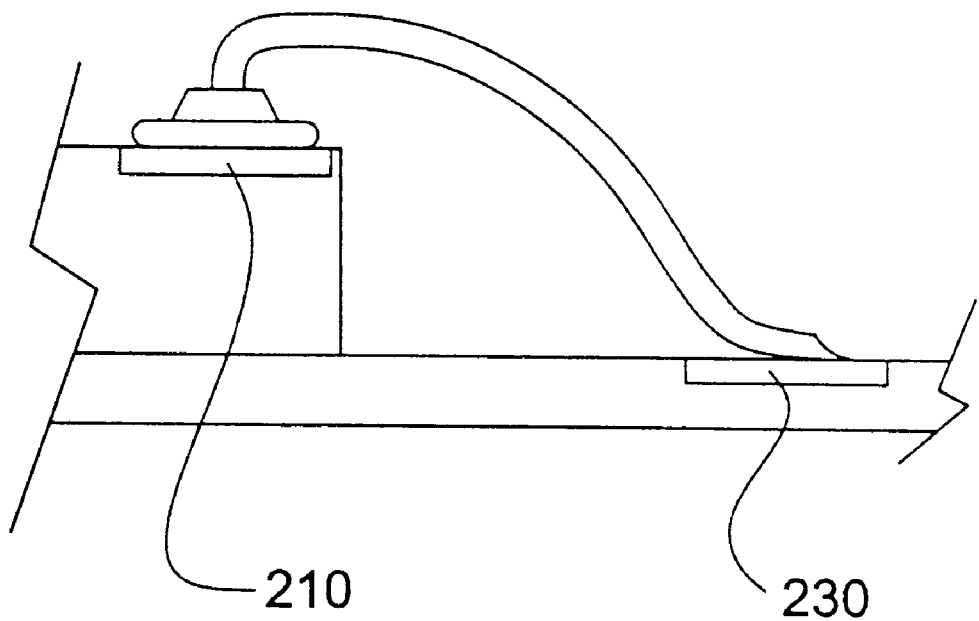
FIG. 1 is a cross sectional view of a wire connection from a bonding pad on a semiconductor chip to a substrate contact pad in accordance with the prior art.
Figure 2A:
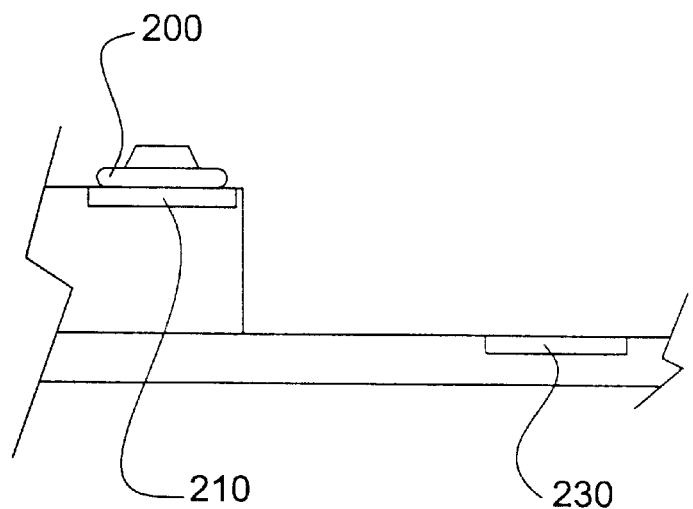
FIGS. 2a and 2b illustrate a wire bonding method disclosed in U.S. Pat. No. 5,735,030.
Figure 2B:
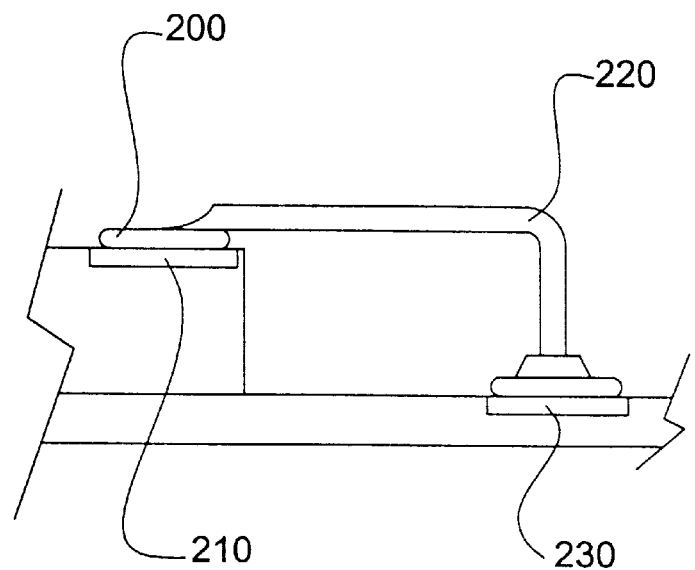
Figure 3:
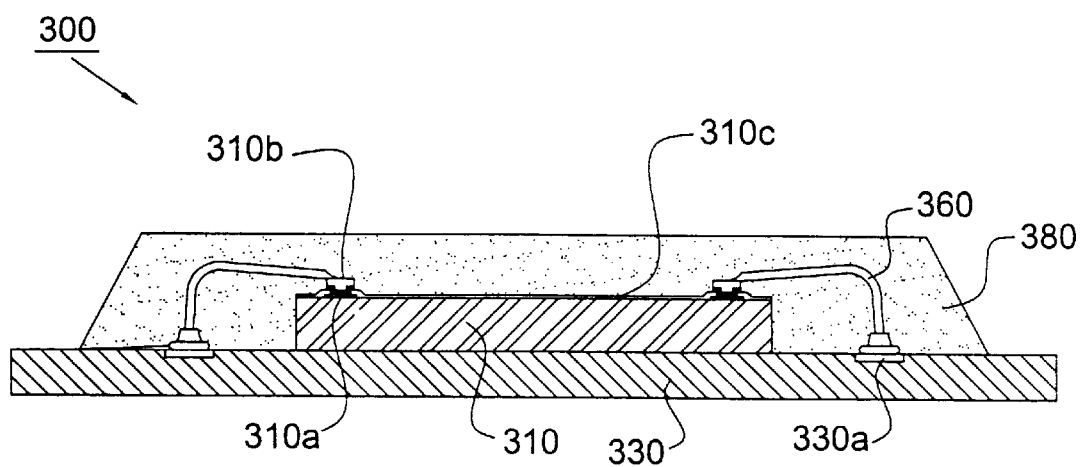
FIG. 3 is a cross sectional view of a semiconductor device according to a preferred embodiment of the present invention.

FIG. 3 shows a semiconductor device 300 according to a preferred embodiment of the present invention. The semiconductor device 300 mainly a chips 310 mounted to a substrate 330. The substrate 330 has a structure for making external electrical connection comprising a plurality of conductive leads 330a. The semiconductor chip 310 has a plurality of bonding pads 310a formed on the active surface thereof. The backside surface of the semiconductor chip 310 is attached to the substrate 330 by means of an adhesive (not shown). The semiconductor device 300 of the present invention is characterized by having a plurality of metal bumps 310b formed on the bonding pads 310a by bumping technology typically used in forming a flip chip. The chip 310 is electrically connected to the conductive leads 330a of the substrate 330 through a plurality of bonding wires 360. The bonding wires 360 have one ends connected to the conductive.leads 330a by ball bonding and the other ends connected to the bumps 310b on the bonding pads 310a by stitch bonding (see FIG. 4). The semiconductor device 300 preferably comprises a package body 380 encapsulating the chip 310 and the bonding wires 360 against a portion of the substrate 330.

Figure 5:
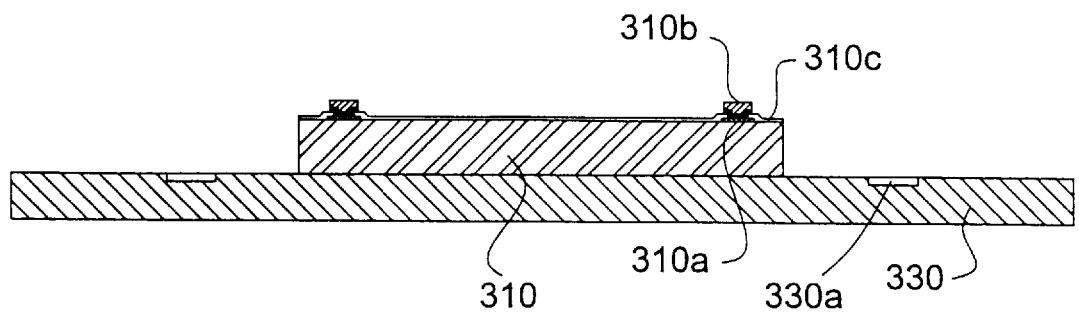
FIGS. 5–6 illustrate in cross-section major steps of a method of making the semiconductor device of FIG. 3 in accordance with the present invention.
Figure 6:
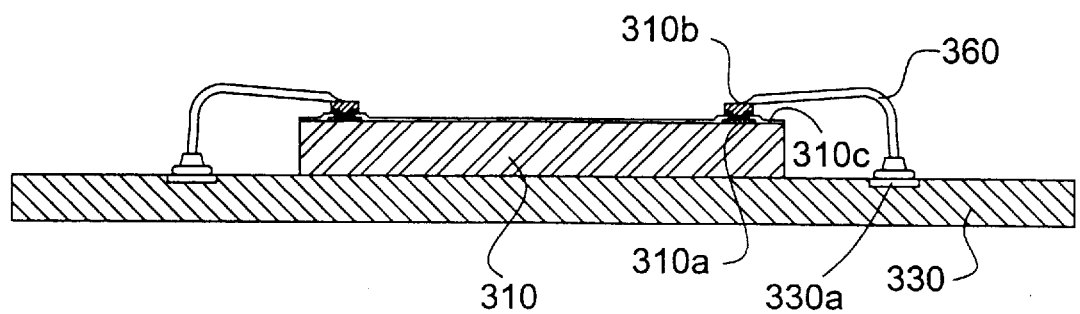

FIGS. 5–6 show major steps of making the semiconductor device 300 according to a preferred embodiment of the present invention.

FIG. 5 shows a semiconductor chip 310 having metal bumps 310b disposed on the bonding pads 310a thereof. The chip 310 is securely attached onto the substrate 330 through an adhesive layer (not shown). As shown, the chip 310 may include a passivation layer 310c formed thereon. Typically, the passivation layer 310c covers top edge portion of each pad 310a, leaving the central surface portion of each pads 310a exposed. It is noted that the metal bumps 310b is preferably formed by wafer bumping process. The bumping process typically comprises (a) forming an under bump metallurgy (UBM) on bonding pads of the chip, and (b) forming metal bumps on the UBM. Typically, UBM consists of two metal layers, including: (a) adhesion layer (formed of Ti, Cr or TiW (more preferred)) for purposes of providing a good adhesion to Al pad and passivation layer and preventing Al pad and the bump electrode from reacting with each other to generate an alloy; and (b) protective layer formed of Au for purposes of preventing oxidation. Conventional ways to form a multi-layer under bump metallurgy (UBM) mainly comprises chemical vapor deposition (CVD), plasma-enhanced chemical vapor deposition (PECVD), or physical vapor deposition (PVD) (sputtering or evaporation).

In a preferred embodiment, the semiconductor chip having metal bumps is formed from wafer-bumping process. The first step is to establish the appropriate UBM. This is implemented by sputtering TiW/Au thin films on the whole wafer first. Then, a layer of photoresist is spin-coated on the wafer and then patterned by photolithography to form opening sections at location corresponding to the die bonding pads. Thereafter, gold bumps are deposited on the exposed bonding pads by electroplating, with the UBM as the electrode. After stripping off the photoresist layer, the UBM outside the die bonding pads is etched away using the plated gold bumps as the etchant resist. Finally, a dicing operation is performed to obtain individual chips having gold bumps formed thereon. In this embodiment, UBM preferably consists essentially of about 1000 Angstroms of titanium-tungsten and about 800 Angstroms of gold. The gold bump preferably project from the passivation layer of the chip by a distance of at least 0.5 mil so as to preserve a spacing between the capillary of ball bonding tool and the chip, thereby protecting the chip against capillary damage. Typically, the thickness of the passivation layer is about 0.2 mil (5 $\mu$m); hence, the gold bump preferably has a thickness of at least 0.7 mil. Alternatively, the metal bumps may be directly formed on the bonding pads of chip by electroless plating about 10 $\mu$m to about 20 $\mu$m of nickel on the bonding pads of each chip, and then electroless plating about 1 $\mu$m or less of gold on the nickel.

The substrate 330 may be formed from a core layer made of fiberglass reinforced BT (bismaleimide-triazine) resin or FR-4 fiberglass reinforced epoxy resin. Alternatively, the substrate 330 may be a ceramic substrate. It should be understood that the substrate 330 may be replaced by a lead frame. Typically, the lead frame comprises a plurality of conductive leads having inner lead portions and outer lead portions wherein the inner lead portions thereof are adapted to be electrically connected to a semiconductor chip and the outer lead portions thereof are used for making electrical connection to outside.

Figure 4:
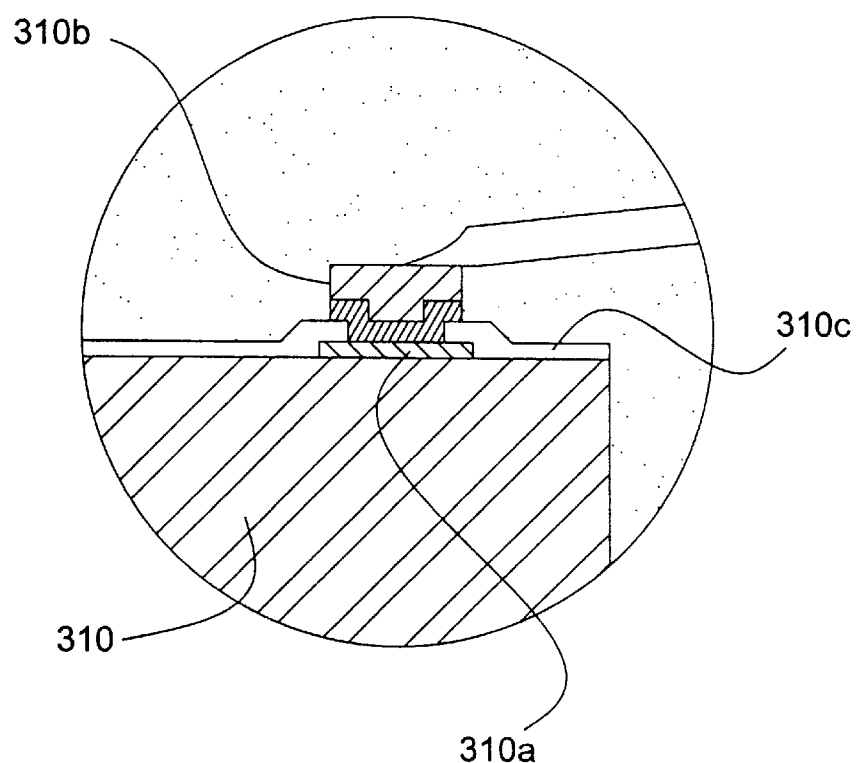
FIG. 4 is a detailed sectional view of metal bumps on the bonding pads of a chip and a bonding wire connected thereto by stitch bonding.

Then, referring to FIG. 6, using a ball bonding tool, first ball bonding one ends of the bonding wires 360 to the conductive leads 330a of the substrate 330 and thereafter stitch bonding the other ends thereof to the metal bumps 310b (also shown in FIG. 4). Preferably, the bonding wires 360 are bent to form a substantially right angle whereby the conductive leads 330a can be designed closer to the chip 310 without the risk of contact between the wire loop and the chip. The metal bumps 310b on the bonding pads 310a provides clearance between the capillary of bonding tool and the bonding pad itself.

Finally, as shown in FIG. 3, a package body 380 is formed over the chip 310 and the wires 360 against a portion of the substrate 330 using known plastic molding methods such as transfer molding.

Figure 8:
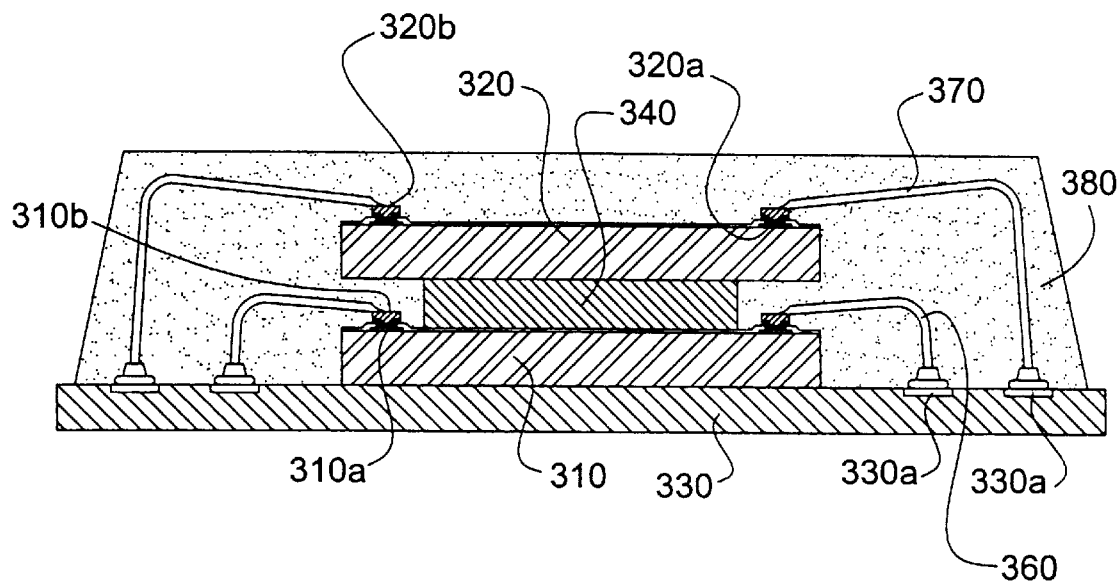

The wire bonding method of the present invention may also be used in forming multi-chip modules (MCMs). As shown in FIG. 8, the multi-chip module mainly comprises two chips 310, 320 stacked each other and mounted to a substrate 330. The backside surface of the semiconductor chip 320 is attached to the active surface of the semiconductor chip 310 through an adhesive layer 340.

Figure 7:
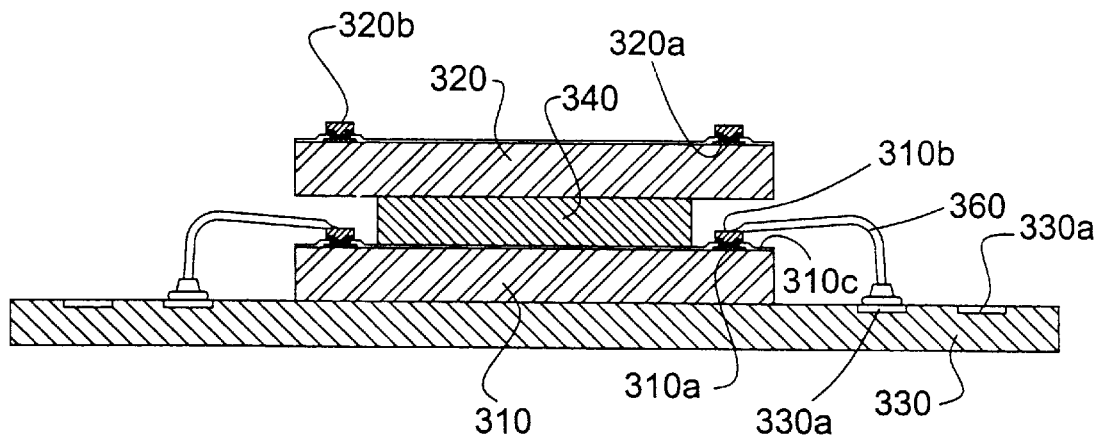
FIGS. 7–8 illustrate in cross-section major steps of a method of making a multi-chip module in accordance with the present invention.

Referring to FIG. 7, the chip 320 having metal bumps 320b is attached onto the chip 310 by an adhesive layer 340. It is noted that the adhesive layer 340 has a thickness (typically at least 4 mils) greater than the loop height of the outwardly projecting loops of the wires 360 so as to prevent the bonding wires 360 from contacting the chip 310.

Thereafter, as shown in FIG. 8, the procedures of making wire bonding are substantially the same as those described in FIG. 6. Finally, a package body 380 is formed over the chips 310, 320 and the wires 360, 370 against a portion of the substrate 330 using known plastic molding methods such as transfer molding.

Figure 9:
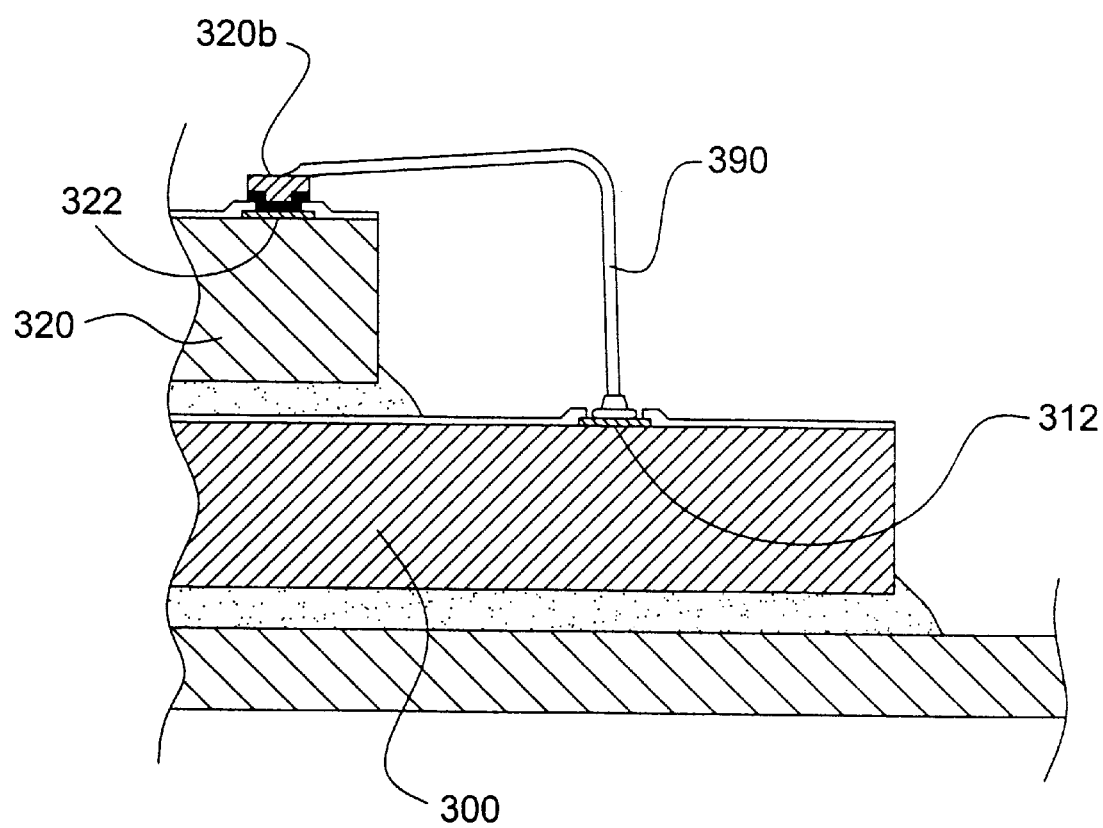
FIG. 9 diagrammatically illustrates the way in which the wire bonding method of the present invention is used to make chip-to-chip connections.

FIG. 9 diagrammatically illustrates the way in which the wire bonding technique just described can be used to make chip-to-chip connections. As seen in this figure, if the bonding pad 312 is to be wire bonded to the bonding pad 322 using the previously conventional ball bonding tool, the bonding wire utilized to make this connection can only be ball bonded to one of the pads. Therefore, a bonding wire must be stitch bonded to the other pad. This is accomplished in the same manner described immediately above. Specifically, as illustrated in FIG. 9, using bumping technology, a bump 320b is initially formed on pad 322 and thereafter, using ball bonding tool, the bonding wire 390 is first ball bonded one end to pad 312 and then stitch bonded at the other end to bump 320b.

According to the present invention, since the metal bumps on the bonding pads of chip are all formed in a single plating step, it is easy to obtain bumps with good uniformity, i.e., having a uniform profile. This will significantly enhance the reliability of stitching bonding formed on the metal bumps. It is noted that the metal bumps are preferably formed at the wafer level. This makes the method of the present invention more preferable than prior arts of reverse bonding as the I/Os of semiconductor chip have become higher and higher. In other words, the multi-chip module of the present invention will gain cost advantage with die shrink and wafer expand.

Although the invention has been explained in relation to its preferred embodiment, it is to be understood that many other possible modifications and variations can be made without departing from the spirit and scope of the invention as hereinafter claimed.

What is claimed is:

1. A method of making a wire connection in a semiconductor device including an electrically conductive lead forming part of a substrate or leadframe, and a semiconductor chip having a bonding pad formed on an active surface thereof, the method comprising:

forming an under bump metallurgy (UBM) over the active surface of the chip including the bonding pad;

forming a bump on the UBM at a location corresponding to the bonding pad;

etching the UBM using the bump as a mask; and connecting one end of a bonding wire to the conductive lead by ball bonding and the other end of the bonding wire to the bump on the bonding pad of the chip by stitch bonding.

2. The method as claimed in claim 1, wherein the UBM forming step comprising forming a titanium-tungsten layer over the active surface of the chip including the bonding pad, and forming a gold layer over the titanium-tungsten layer.

3. A method of making a wire connection in a semiconductor device including an electrically conductive lead forming part of a substrate or leadframe, and a semiconductor chip having a bonding pad formed on an active surface thereof, the method comprising:

electroless plating a nickel layer on the bonding pad of the chip, and electroless plating a gold layer on the nickel layer so as to form a bump on the bonding pad; and connecting one end of a bonding wire to the conductive lead by ball bonding and the other end of the bonding wire to the bump on the bonding pad of the chip by stitch bonding.

4. The method as claimed in claim 3, wherein the nickel layer has a thickness of about 10 $\mu$m to about 20 $\mu$m, and the gold layer has a thickness of about 1 $\mu$m or less.

5. A method of making a wire connection in a semiconductor device including a first semiconductor chip and a second semiconductor chip, each of which includes a bonding pad, the method comprising:

forming an under bump metallurgy (UBM) over an active surface of the first chip including the bonding pad thereof;

forming a bump on the UBM at a location corresponding to the bonding pad of the first chip;

etching the UBM using the bump as a mask; and connecting one end of a bonding wire to the bonding pad of the second chip by ball bonding and the other end of the bonding wire to the bump on the bonding pad of the first chip by stitch bonding.

6. The method as claimed in claim 5, wherein the UBM forming step comprising forming a titanium-tungsten layer over the active surface of the first chip including the bonding pad of the first chip, and forming a gold layer over the titanium-tungsten layer.

7. A method of making a wire connection in a semiconductor device including a first semiconductor chip and a second semiconductor chip, each of which includes a bonding pad, the method comprising:

electroless plating a nickel layer on the bonding pad of the first chip, and electroless plating a gold layer on the nickel layer so as to form a bump on the bonding pad of the first chip; and connecting one end of a bonding wire to the bonding pad of the second chip by ball bonding and the other end of the bonding wire to the bump on the bonding pad of the first chip by stitch bonding.

8. The method as claimed in claim 7, wherein the nickel layer has a thickness of about 10 $\mu$m to about 20 $\mu$m, and the gold layer has a thickness of about 1 $\mu$m or less.

9. A method of making a multi-chip module comprising:

providing a first chip and a second chip, each having bonding pads formed on an active surface thereof;

forming an under bump metallurgy (UBM) over the active surface of each chip including the bonding pads;

forming bumps on the UBMs at locations corresponding to the bonding pads;

etching the UBMs using the bumps as masks;

attaching the first chip to means for supporting the chips, the supporting means comprising a plurality of first and second conductive leads;

connecting one end of each of a plurality of lower bonding wires to the first conductive leads of the supporting means by ball bonding and the other end of each lower bonding wire to one of the bumps on the bonding pads of the first chip by stitch bonding;

attaching the second chip to the active surface of the first chip; and connecting one end of each of a plurality of upper bonding wires to the second conductive leads of the supporting means by ball bonding and the other end of each upper bonding wire to one of the bumps on the bonding pads of the second chip by stitch bonding.

10. The method as claimed in claim 9, wherein the UBM forming step comprising forming a titanium-tungsten layer over the active surface of each chip including the bonding pads, and forming a gold layer over each of said the titanium-tungsten layer.

11. The method as claimed in claim 9, further comprising the step of encapsulating the first and second chips as well as the upper and lower bonding wires against a portion of the supporting means.

12. The method as claimed in claim 9, wherein the supporting means is a substrate.

13. The method as claimed in claim 9, wherein the supporting means is a lead frame.

14. A method of making a multi-chip module comprising:

providing a first chip and a second chip, each having bonding pads formed on an active surface thereof;

electroless plating a nickel layer on the bonding pads of each chip, and electroless plating a gold layer on the nickel layer so as to form a plurality of bumps on the bonding pads of each chip;

attaching the first chip to means for supporting the chips, the supporting means comprising a plurality of first and second conductive leads;

connecting one end of each of a plurality of lower bonding wires to the first conductive leads of the supporting means by ball bonding and the other end of each lower bonding wire to one of the bumps on the bonding pads of the first chip by stitch bonding;

attaching the second chip to the active surface of the first chip; and connecting one end of each of a plurality of upper bonding wires to the second conductive leads of the supporting means by ball bonding and the other end of each upper bonding wire to one of the bumps on the bonding pads of the second chip by stitch bonding.

15. The method as claimed in claim 14, wherein the nickel layer has a thickness of about 10 $\mu$m to about 20 $\mu$m, and the gold layer has a thickness of about 1 $\mu$m or less.

16. The method as claimed in claim 14, further comprising the step of encapsulating the first and second chips as well as the upper and lower bonding wires against a portion of the supporting means.

17. The method as claimed in claim 14, wherein the supporting means is a substrate.

18. The method as claimed in claim 14, wherein the supporting means is a lead frame.

19. The method as claimed in claim 1, wherein the bump is a gold bump.

20. The method as claimed in claim 5, wherein the bump is a gold bump.

21. The method as claimed in claim 9, wherein the bumps are gold bumps.

* * * * *